United States Patent
Willer et al.

(10) Patent No.: US 7,602,649 B2
(45) Date of Patent: Oct. 13, 2009

(54) METHOD OF OPERATING AN INTEGRATED CIRCUIT FOR READING THE LOGICAL STATE OF A MEMORY CELL

(75) Inventors: Josef Willer, Riemerling (DE); Detlev Richter, Munich (DE)

(73) Assignees: Qimonda AG, Munich (DE); Qimonda Flash GmbH, Dresden (DE)

( * ) Notice: Subject to any disclaimer, the term of this patent is extended or adjusted under 35 U.S.C. 154(b) by 139 days.

(21) Appl. No.: 11/849,828

(22) Filed: Sep. 4, 2007

(65) Prior Publication Data

US 2009/0059673 A1    Mar. 5, 2009

(51) Int. Cl.
*G11C 16/06* (2006.01)

(52) U.S. Cl. .......................... 365/185.21; 365/189.01; 365/189.07; 365/185.17; 365/185.18

(58) Field of Classification Search ............ 365/189.01, 365/189.07, 185.17, 185.18, 185.21
See application file for complete search history.

(56) References Cited

U.S. PATENT DOCUMENTS

| 6,650,562 | B2 * | 11/2003 | Holden et al. ................. 365/97 |
| 7,262,995 | B2 | 8/2007 | Kim |
| 7,292,471 | B2 * | 11/2007 | Sakimura et al. ............ 365/173 |
| 7,529,130 | B2 * | 5/2009 | Toda ...................... 365/185.12 |

* cited by examiner

*Primary Examiner*—Connie C Yoha
(74) *Attorney, Agent, or Firm*—Slater & Matsil, L.L.P.

(57) ABSTRACT

In an embodiment of the invention, a method of operating an integrated circuit for reading the logical state of a selected one of a plurality of memory cells included within a memory cell string in the integrated circuit is provided.

19 Claims, 3 Drawing Sheets

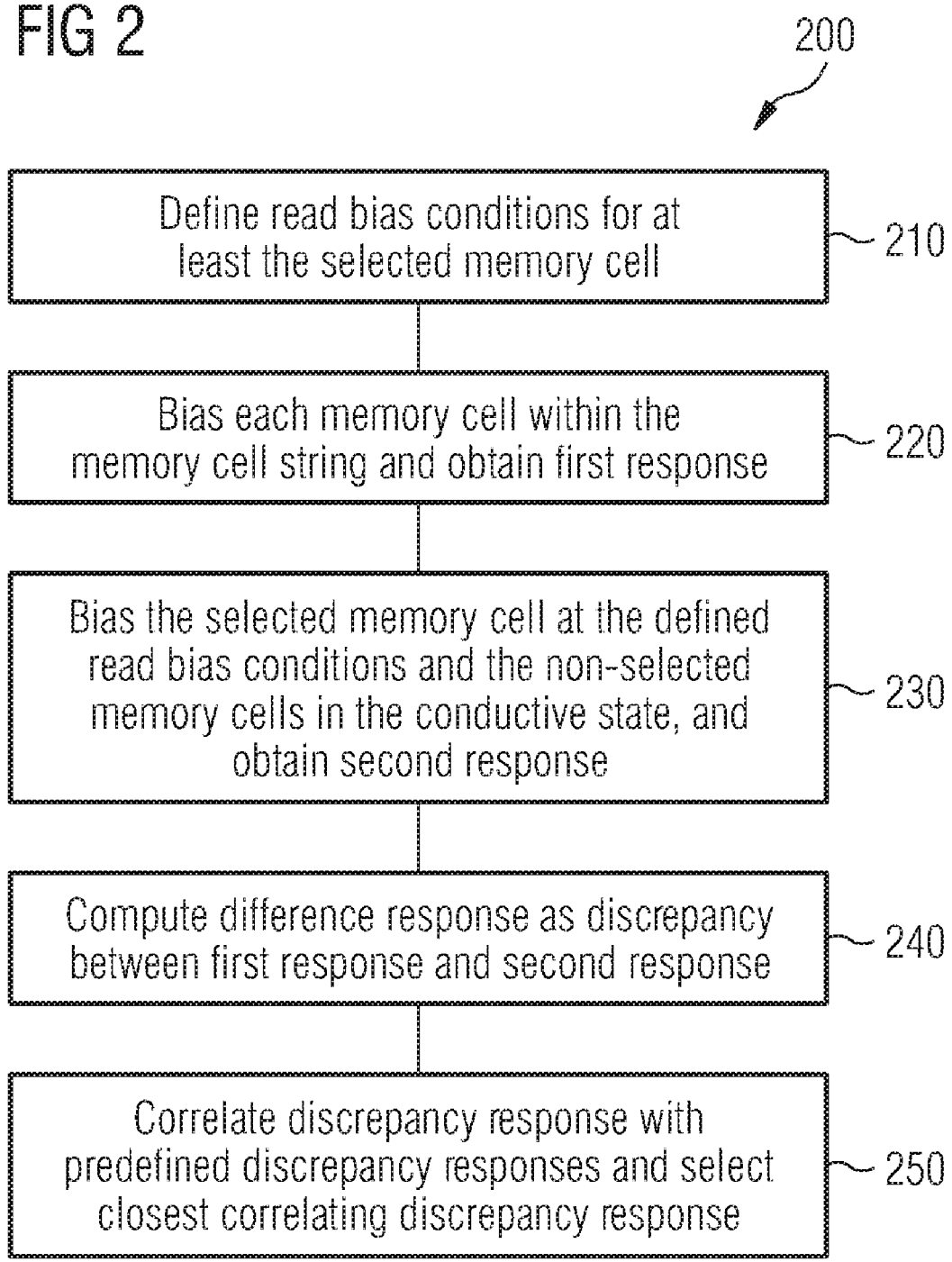

METHOD OF OPERATING AN INTEGRATED CIRCUIT FOR READING THE LOGICAL STATE OF A MEMORY CELL

TECHNICAL FIELD

Embodiments of the present invention relate generally to a method of operating an integrated circuit for reading the logical state of a memory cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for reading the logical state of a memory cell included within a memory cell string in accordance with one embodiment of the invention;

DETAILED DESCRIPTION OF ILLUSTRATIVE EMBODIMENTS

Figure 1A:
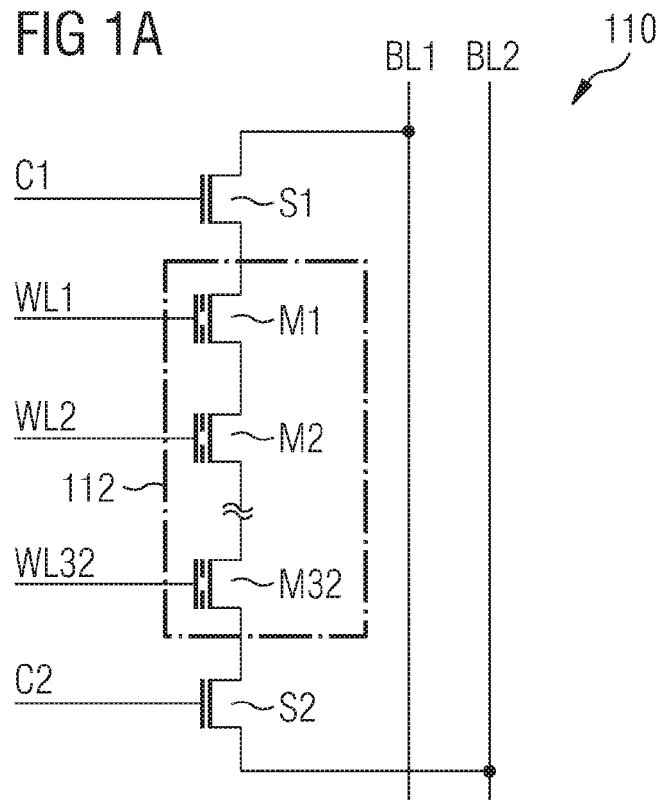
FIG. 1A shows a memory cell string of an integrated circuit in accordance with one embodiment of the invention.

Non-volatile memory devices have been widely used in code and data storage applications, and their further use and wider adoption depends upon improvements in storage density and reading accuracy. One type of non-volatile memory device, the electrically-erasable and programmable read only memory (EEPROM or Flash) device, shows particular promise with regard to improved scalability. In particular, e.g., NAND memory string architectures within Flash memory devices enables implementation of a large number of serially-coupled memory cells within a very small chip area, thereby providing high storage density. It should be mentioned that the embodiments of the invention are not limited to a NAND memory string architecture but can also be applied, e.g., to a different memory cell architecture where there is no complete individual access to an individual cell. Other advancements have also been developed to further increase storage density of the non-volatile memory device. For example, multi-bit memory cells and charge trapping architectures represent two developments which promise to further advance the scalability of non-volatile memory devices.

Notwithstanding the aforementioned advancements in improved scalability of non-volatile memory devices, similar improvements in the accuracy with which data can be read from the memory cells has been elusive. In particular, the NAND string architecture which enables serial coupling of a large number of memory cells for greater memory density, also presents challenges in accurately reading the stored logical state of the cells due to cell-to-cell variations in conductivity, threshold voltage, and other parameters. Aggravating this condition, the read threshold voltage for some memory architectures approaches the memory cell's erase threshold voltage, thereby increasing the risk that a read operation for a memory cell could inadvertently result in erasing the content of the memory cell.

Accordingly, what is needed is a method for accurately reading non-volatile memory devices.

Embodiments of the invention provide techniques for reliably reading logical states of non-volatile memory cells arranged in a memory string.

As used herein the terms connected and coupled are intended to include both direct and indirect connection and coupling, respectively.

In the context of this description, a "volatile memory cell" may be understood as a memory cell storing data, the data being refreshed during a power supply voltage of the memory system being active, in other words, in a state of the memory system, in which it is provided with power supply voltage.

A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

As used herein the term "multi-bit" memory cell is intended to, e.g., include memory cells which are configured to store a plurality of bits by spatially separated electric charge storage regions or current conductivity regions, thereby representing a plurality of logic states.

As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

FIG. 1A illustrates a memory cell arrangement 110, e.g., a memory cell string 110 in accordance with one embodiment of the present invention.

In an embodiment of the invention, the memory cell string 110 includes, e.g., memory cells M1-M32 (designated in FIG. 1A with reference numeral 112) serially-coupled in a drain-to-source memory cell string configuration 112, e.g., in a drain-to-source NAND string configuration 112. Further included in the memory cell string 110 are select transistors S1 and S2 operable to provide (when switched on by control signals C1 and C2, e.g., by applying bias conditions to the select transistors S1 and S2, e.g., by applying bias voltages to the terminals of the select transistors S1 and S2, e.g., to their drain terminals, source terminals, gate terminals, and/or bulk terminals) the appropriate drain and source voltages to the desired memory cell M1-M32. As shown, each select transistor S1 and S2 is coupled to bit lines BL1 and BL2, respectively, as each bit line will be energized at the appropriate drain and source voltage when switched (via S1 and S2) to the memory cell string 110. In an alternative embodiment of the invention, the second bit line BL2 could be replaced, e.g., by a common source line shared by a plurality of NAND strings.

Different cell types may be employed with various embodiment of the invention. For example, the memory cells M1-M32 may comprise non-volatile electrically-erasable programmable read only memory (Flash EEPROM) devices. In another embodiment, the memory cells M1-M32 are ferroelectric transistor memory devices. In an alternative embodiment of the invention, any other suitable type of transistor based memory may be used. The memory cell may be capable of storing a single memory bit, or multiple bits. Within the memory cell itself, further refinements may be included. For example when a Flash EEPROM cell is employed, the gate terminal may include a charge trapping or floating gate structure. Those skilled in the art will appreciate that other cell architectures may be implemented in embodiments of the invention.

One embodiment of the invention finds particular utility in memory devices in which programming or erase bias conditions are relatively similar to read bias conditions. In such circumstances, the process of reading a memory cell can affect the memory cell, possibly inadvertently programming or erasing one or more memory cells of the memory cell string. In one embodiment of the invention, the read threshold voltage is selected as far away (i.e., as low as possible) from the erase voltage threshold to avoid inadvertent erasure of the one or more memory cells of the memory cell string.

Figure 1B:
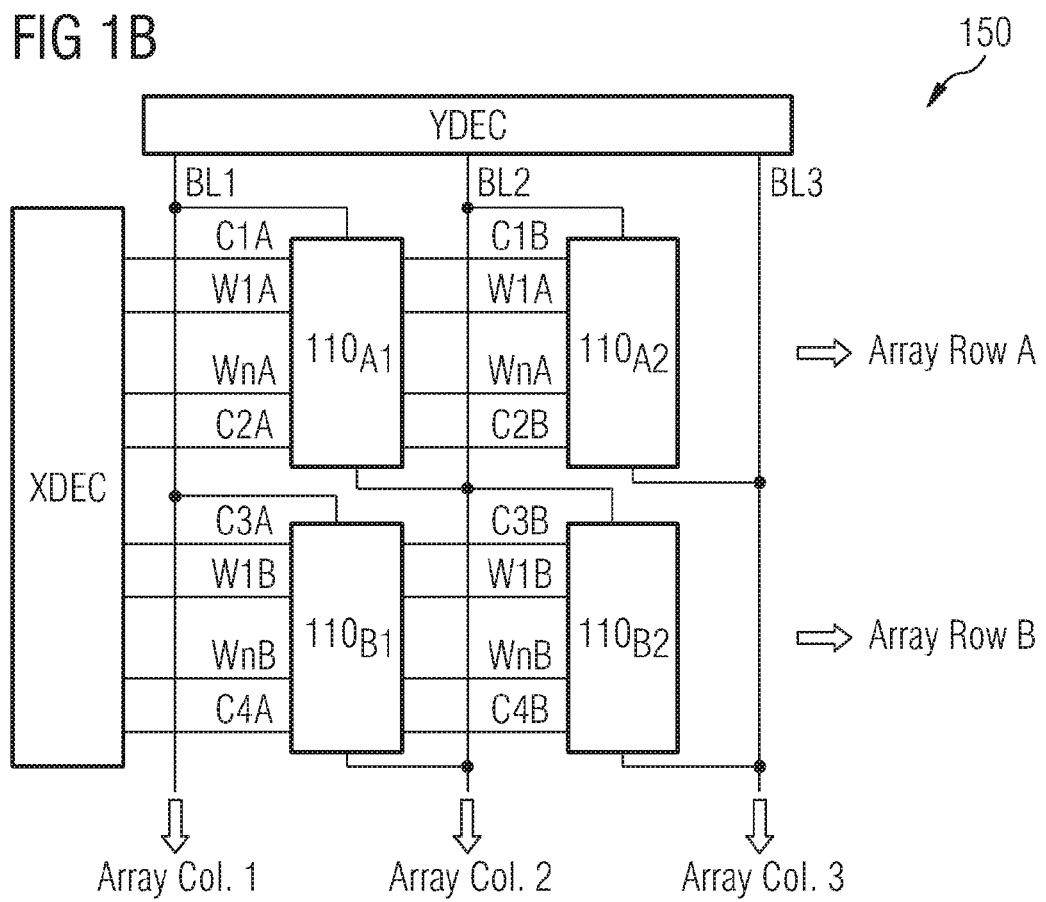
FIG. 1B shows a memory array in accordance with one embodiment of the invention.

FIG. 1B illustrates a memory array 150 in accordance with one embodiment of the present invention. The memory array 150 includes a row decoder XDEC, a column decoder YDEC, and an array of memory cell strings 110.

The row decoder XDEC includes word lines W1A-WnA coupled to respective gate terminals of memory cells in memory cell strings $110_{A1}$ and $110_{A2}$ (along array row A), and word lines W1B-WnB coupled to respective gate terminals of memory cells in memory cell strings $110_{B1}$ and $110_{B2}$ (along array row B). Control signals C1A and C2A are supplied to the gate terminals of the select transistors in memory cell string $110_{A1}$ (bit line 1), and control signals C2A and C2B are supplied to gate terminals select transistors in the memory cell string $110_{A2}$ (bit line 2). Control signal C1A is operable to couple memory cell string $110_{A1}$ to bit line BL1, and control signal C2A is operable to couple memory cell string $110_{A1}$ to BL2. Control signals C1B and C2B operate to control the coupling of memory cell string $110_{A2}$ to bit lines BL2 and BL3, respectively. Similarly, control signals C3A, C3B, and C4A, C4B control select transistors for memory cell strings $110_{B1}$ and $110_{B2}$.

FIG. 2 illustrates a method 200 for reading the logical state of a memory cell included within a memory cell string of an integrated circuit in accordance with one embodiment of the invention.

Initially at 210, a read bias condition is defined for at least a selected memory cell. In one embodiment of this operation, the read bias condition is a read threshold voltage applied to one or more gate terminals of the memory cells within the memory cell string 110. In another embodiment of the invention, the read bias condition comprises drain and/or source bias conditions employed in a read operation of the memory cell. In yet another embodiment of the invention, the read bias condition comprises bulk bias conditions employed in a read operation of the memory cell. In general, the different bias conditions may be applied in an arbitrary combination, e.g., gate bias conditions may be applied together with the drain and/or source bias conditions and the bulk bias condition employed in a read operation of the memory cell. Further in exemplary embodiments, the read bias condition may be defined for the selected memory cell and may be applied globally for each memory cell in the memory cell string 110. In still another embodiment, the read bias condition is defined for only a selected one of the memory cells, with process 210 being repeated for each of the memory cells within the memory cell string 110. An exemplary embodiment of operation 210 is further described below.

Subsequently at 220, a first measurement of the memory cell string is performed wherein each of the memory cells within the memory cell string 110 is rendered conductive due to the application of corresponding bias conditions, and a first response of the memory cell string 110 is recorded. The first response represents a baseline response of the memory cell string against which another response (which will be described in more detail below) is compared to ascertain the stored content of a selected memory cell, in other words to determine the logical state of the selected memory cell. The measurement of the first response (in the following also referred to as first measurement), in one embodiment, is performed by measuring the current output from the memory cell string 110. In another embodiment, the first measurement is performed by measuring the resulting voltage developed across the memory cell string 110. As those skilled in the art will appreciate, the bias conditions required to render the memory cell conductive (in other words, the bias conditions required to bring the memory cells in a conductive state) will depend upon the type and construction of the memory cell. For a two-bit Flash charge trapping memory cell, exemplary bias conditions include a gate (pass) voltage of about 5 V-6 V, a drain voltage of about 0.6 V, and a source voltage of about 0 V (it should be noted that the bias conditions strongly depend on the memory cell type; the drain voltage and the source voltage should be selected to be as small as possible). Further exemplary embodiments of 220 are further described below.

At 230, a second measurement is performed, whereby a selected memory cell within the string is biased at the read threshold voltage as provided in 210, and the non-selected memory cells are biased in a conductive state, as in 220. The second measurement obtained in 230 represents the read response of the selected memory cell in combination with the responses of each of the non-selected memory cells. In one embodiment of the invention, the second measurement is performed by measuring the string output current when the selected and non-selected memory cells are biased as described above. In another embodiment of the invention, the second measurement is performed by measuring the resulting voltage developed across the memory cell string 110 under the aforementioned memory cell bias conditions. Exemplary embodiments of 230 are further described below.

Subsequently at 240, the discrepancy between the first response and the second response is computed, the discrepancy corresponding to the logical state stored in the selected memory cell. In a particular embodiment of this operation, a discrepancy response Res is computed as the absolute value of the difference between the first and second responses, wherein in an alternative embodiment of the invention, the discrepancy response Res is a function generally evaluating the discrepancy between the first response and the second response. Thus, the discrepancy response Res is computed in accordance to the following formula:

$$\text{Res}=f(|R_{2nd}-R_{1st}|).$$

The discrepancy response Res represents the read response of the selected memory cell, as the parasitic, resistive and neighbor effects contributed by the non-selected memory cells in the string are reproduced in both the first and second measurements, and thereby cancelled out by the difference operation. In an embodiment of the invention, the non-selected memory cells are extracted from the read response, and such effects may thus improve the conventional reading technique.

Next, at 250, the discrepancy response Res is correlated to a plurality of predefined discrepancy responses, each of the predefined discrepancy responses corresponding to a stored logical state of the selected memory cell. In one embodiment in which the memory cells store a single bit, two predefined discrepancy responses are provided (a first discrepancy response corresponding to a logical "1," a second discrepancy response corresponding to a logical "0") to which the string discrepancy response Res is correlated. In another embodiment in which the memory cells store two bits, four predefined discrepancy responses are provided (corresponding to logical states "00" (first discrepancy response), "01" (second discrepancy response), "10" (third discrepancy response), and "11" (fourth discrepancy response)) to which the string discrepancy response Res is compared. The logical state corresponding to the closest correlating predefined discrepancy response is deemed the stored logical state of the selected memory cell within the memory cell string 110.

Figure 3A:
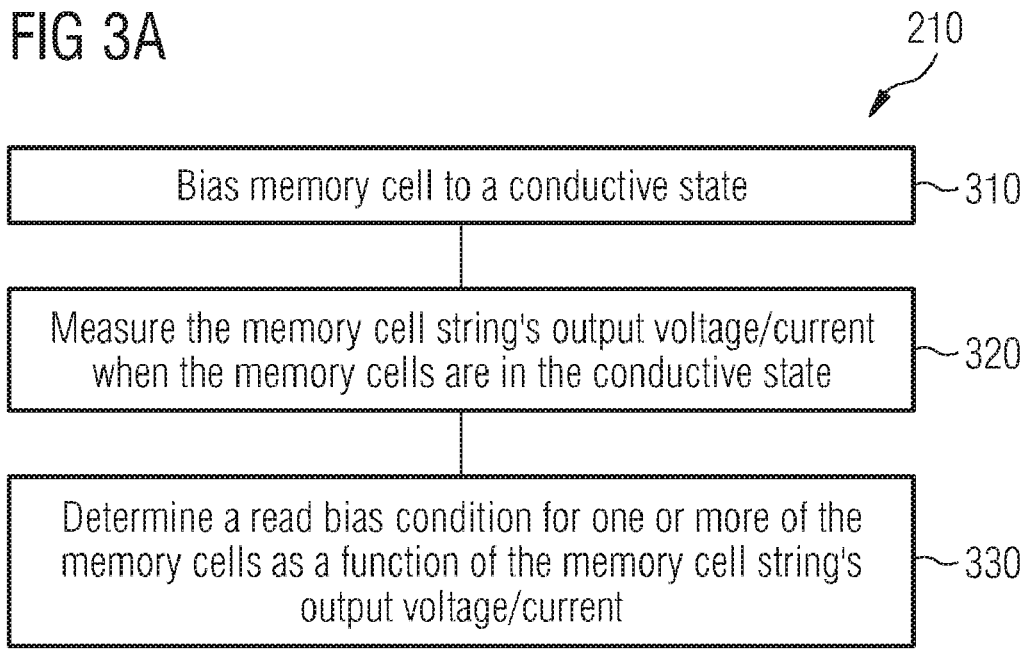
FIG. 3A shows an exemplary embodiment of a method shown in FIG. 2 in which a read bias condition in a memory cell string is determined in accordance with one embodiment of the invention.

FIG. 3A illustrates an exemplary embodiment of operation 210 shown in FIG. 2 in which a read bias condition in a memory cell string is determined in accordance with the present invention.

Initially at 310, each of the memory cells in the memory cell string 110 is biased in a conductive state. The particular bias conditions needed to render the memory cell conductive will depend upon the memory cell structure and the memory cell type employed. For example, the gate (pass) voltage, drain voltage, and source voltage needed to render a multi-bit Flash EEPROM charge trapping cell conductive may be about 5V to about 6V, about 0V and about 0.5 to about 0.8V (in general, they should be selected as low as possible and as high as necessary to achieve the predefined maximum string current (this depends strongly on memory cell type, for some memory cells, applying a suitable gate voltage is enough). Other bias conditions used to render other cell types conductive will be apparent to those skilled in the art.

At 320, the memory cell string's output voltage and/or output current is measured (e.g., using sense amplifiers) when the memory cells are in the aforementioned conductive state. In one embodiment, the output current of the memory cell string is used as the measurement parameter. In another embodiment, the voltage developed across the memory cell string is used as the measurement parameter.

At 330, the read threshold voltage is determined as a function of the output voltage/current measured in 320.

Figure 3B:
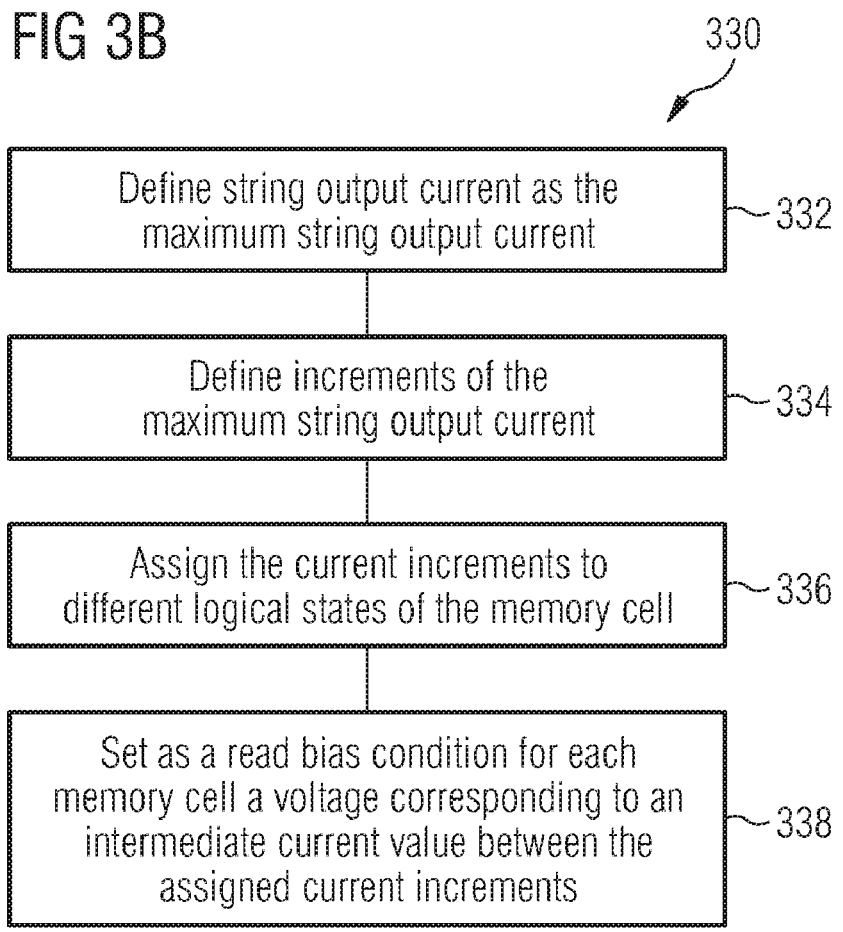
FIG. 3B shows an exemplary embodiment of a method shown in FIG. 3A in which a read threshold voltage for one or more of the memory cells is determined as a function of the string output voltage or as a function of the string output current in accordance with one embodiment of the invention.

FIG. 3B illustrates an exemplary embodiment of operation 330 shown in FIG. 3A in which a read level threshold voltage for one or more of the memory cells is determined as a function of the memory cell string output voltage/current in accordance with the present invention. Initially at 332, the string output current measured in 320 is defined as the maximum output current of the memory cell string. At 334, increments of the maximum string output current are defined. At 336, the current increments are assigned different logical states of the memory cells. At 338, a read threshold voltage is set as a read bias condition for each memory cell, the read threshold voltage corresponding to an intermediate current value between the plurality of assigned current increments.

As an example of the operations shown in FIG. 3B, a maximum string current of about 8 µA is defined in 332 for a two-bit memory cell, as an 8 µA current is measured when each of the memory cells in the string are rendered conductive in operation 320. Subsequently at 334, four current increments are defined, 0-2 µA, 2-4 µA, 4-6 µA, and 6-8 µA. At 336, each current increment is assigned a logical state of the two-bit cell; for example 0 µA-2 µA→first logical state "00";
2 µA-4 µA→second logical state "01";
4 µA-6 µA→third logical state "11"; and
6 µA-8 µA→fourth logical state "10".

At operation 338, a read bias condition (e.g., read threshold voltages) is set as the voltages corresponding to intermediate current values occurring between the assigned current increments. In this case, read threshold voltages are set at voltages corresponding to current levels of about 2 µA, 4 µA and 6 µA. Of course, other bias conditions may be used in accordance with an alternative embodiment of the present invention. For example, the aforementioned conditions may apply to a single-bit memory in which two current increments are mapped to logical states "0" and "1":

0 µA-4 µA→first logical state "0"; and
4 µA-8 µA→second logical state "1", the corresponding read threshold voltage being set at a voltage corresponding to a current level of about 4 µA.

Additionally, while the foregoing embodiments illustrate equal current increments, they may be unequal in other embodiments under the invention In one embodiment of the invention, one or more of the memory cells in the memory cell string are limited in their conduction, i.e., some memory cells under the same bias conductions may operate at a lower conductive state compared to the other memory cells. With reference to the aforementioned exemplary embodiment above, one or more memory cells may operate to conduct current less than about 8 µA when biased in the conductive state. Such a bias condition may arise when one or more memory cells have different operating conditions, higher resistivity, or threshold voltage.

One embodiment of the present invention provides several approaches to remedy the aforementioned condition in which one or more of the memory cells are conduction-limited. In one embodiment, the operation 320 includes the process of determining that the measured string output current of one or more memory cells is lower (e.g., about 6 µA) than a predefined string output current (e.g., about 8 µA). The predefined string output current will be known apriori based upon knowledge of the memory cell fabrication process, anticipated bias conditions, and cell gate periphery. When one or more memory cells are conduction-limited, processes 332 to 338 are carried out with the output limited current operating as the maximum string output current, e.g., about 6 µA in the foregoing embodiment.

In such an instance, 1.5 µA current increments are assigned to four logical states for the two-bit cell:

0 µA-1.5 µA→first logical state "00";
1.5 µA-3 µA→second logical state "01";
3 µA-4.5 µA→third logical state "10"; and
4.5 µA-6 µA→fourth logical state "11";

and read threshold voltages are set at voltages corresponding to current levels of about 1.5 µA, 3 µA and 4.5 µA. In a further particular embodiment, when the memory cell string output current is measured below a predefined lower limit (e.g., about 5 µA), the memory cell string is deemed defective, and earmarked as unusable.

In another embodiment of the invention, the read threshold voltage applied to each memory cell is increased in order to raise the conductivity of the limited memory cell to a conduction level above the predefined lower limit. In such an embodiment, the increase in the read threshold voltage is limited so that it does not become too close to the erase voltage threshold of the memory cell string. Alternatively, the string's conductivity is raised above the predefined lower limit by increasing the string voltage applied across the memory cell string (i.e., source-to-drain voltage).

In another embodiment of the invention, the conduction-limited memory cell is identified, and the bias condition of the identified cell is altered in order to raise the cell's conductivity in line with the other memory cells. Identification of the conduction-limited memory cell may be performed by ramping all pass voltages sequentially to a, e.g., 1V higher pass voltage and monitor (measure) in parallel the maximum string output current. If the failing memory cell will be ramped, the maximum string output current achieves the target value, then change only this word line voltage to a higher pass voltage and start the rest of the operation. In one example, the read threshold voltage of the identified memory cell is modified (e.g., increased) in order to raise the memory cell's conductivity to match that of the other memory cell string's cells, the increase in the pass voltage in one embodiment being lower than the erase voltage threshold. In another example, the source-drain voltage of the identified memory cell is modified (e.g., increased) in order to raise the cell's conductivity.

The aforementioned techniques of correcting conduction-limited memory cells can be employed in numerous ways to read one or more strings either along a row of the memory array, along a column of the memory array, or a combination of both. Referring again to FIG. 1B, conduction-limited memory cells within memory strings $110_{A1}$ and $110_{B1}$ along column 1 can be read by altering bit line voltages BL1 and BL2, which is the voltage developed across each of the memory strings $110_{A1}$ and $110_{B1}$. Conduction-limited memory cells within memory strings $110_{A1}$ and $110_{A2}$ along array row A can be read by altering read threshold voltages along word lines W1A-WnA, the read threshold voltage being raised either on a particular word line to induce greater conduction in a memory cell identified as having a lower conduction state, or along all words W1A-WnA supplying an entire memory cell string, thereby raising the lowest conducting memory cell above a predefine current lower limit.

As readily appreciated by those skilled in the art, the described processes may be implemented in hardware, software, firmware or a combination of these implementations as appropriate. As an example, each of the described processes may be carried out by conventional processing equipment (e.g., semiconductor processing equipment). Furthermore, some or all of the described processes may be implemented as computer readable instruction code that is resident on a computer readable medium (removable disk, volatile or non-volatile memory, embedded processors, etc.), the instruction code operable to program a computer, semiconductor processing equipment, or other such programmable device to carry out the intended functions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of operating an integrated circuit for reading a logical state of a selected one of a plurality of memory cells included within a memory cell string in the integrated circuit, the method comprising:
    defining a read bias condition for at least the selected memory cell;
    performing a first measurement of the memory cell string to obtain a first response, wherein each of the memory cells in the memory cell string is biased in a conductive state;
    performing a second measurement of the memory cell string to obtain a second response, wherein the selected memory cell is biased at a read bias condition, and the non-selected memory cells are biased in the conductive state; and
    determining the logical state of the selected memory cell using a discrepancy between the first response and the second response.

2. The method of claim 1, further comprising:
    correlating the discrepancy between the first response and the second response to a plurality of predefined discrepancy responses, each of the predefined discrepancy responses corresponding to a stored logical state of the selected memory cell;
    wherein the logical state corresponding to the predefined discrepancy response having the closest correlation to the discrepancy response between the first response and the second response is deemed as the stored logical state of the memory cell.

3. The method of claim 1, wherein performing the first measurement comprises measuring an output current response when each of the memory cells is biased in the conductive state, and wherein performing the second measurement comprises measuring the output current response of the memory cell string when the selected memory cell is biased at the read bias condition, and each of the non-selected memory cells is biased in the conductive state.

4. The method of claim 1, wherein determining the discrepancy between the first response and the second response comprises determining an absolute value of a difference between the second response and the first response in accordance to:

$$\mathrm{Res} = f(|R_{2nd} - R_{1st}|).$$

5. The method of claim 2, wherein correlating the discrepancy between the first response and the second response to the plurality of predefined discrepancy responses comprises correlating the discrepancy to each of the plurality of predefined discrepancy responses of the memory cell string.

6. The method of claim 1, wherein defining the read bias condition comprises:
    biasing each memory cell in the memory cell string to the conductive state; and
    measuring an output voltage of the memory cell string when each of the memory cells in the memory cell string are in the conductive state.

7. The method of claim 6, wherein defining the read bias condition further comprises determining a read threshold voltage for one or more memory cells using the output voltage of the memory cell string.

8. The method of claim 7, wherein measuring the output voltage of the memory cell string comprises measuring a string output voltage that is lower than a predefined string output voltage.

9. The method of claim 1, wherein defining the read bias condition further comprises:
    biasing each memory cell in the memory cell string to the conductive state; and
    measuring an output current of the memory cell string when each of the memory cells in the memory cell string are in the conductive state.

10. The method of claim 9, wherein defining the read bias condition further comprises determining the read threshold voltage for one or more memory cells using the output current of the memory cell string.

11. The method of claim 10, wherein the measuring of the output current of the memory cell string comprises measuring a string output current that is lower than a predefined string output current.

12. The method of claim 11, wherein determining the read threshold voltage for one or more of the memory cells comprises:
    defining the string output current as a maximum string output current;
    defining a plurality of current increments of the maximum string output current;
    assigning the plurality of current increments to different logical states of each memory cell of the memory cell string; and
    setting as the read threshold voltage for each memory cell, a voltage corresponding to an intermediate current value which is between a plurality of assigned current increments.

13. The method of claim 12, wherein setting the read threshold voltage for one or more of the memory cells comprises increasing a pass voltage applied to a gate terminal of each memory cell, wherein the increased pass voltage is lower than a predefined gate erase voltage.

14. The method of claim 12, wherein setting the read threshold voltage for one or more of the memory cells comprises increasing a string voltage applied across the memory cell string.

15. The method of claim 12, further comprising:
    identifying at least one memory cell in the memory cell string that limits the string output current to a value below the predefined string output current;
    wherein setting the read threshold voltage for one or more of the memory cells comprises increasing the pass voltage on the gate terminal of at least one current limited memory cell, wherein the increasing pass voltage is lower than the predefined gate erase voltage.

16. An integrated circuit for reading a logical state of a selected one of a plurality of memory cells included within a memory cell string, the integrated circuit comprising:
    a controller to define a read bias condition for at least the selected memory cell;
    a measurement circuit to perform a first measurement of the memory cell string to obtain a first response, wherein each of the memory cells in the memory cell string is biased in a conductive state, and to perform a second measurement of the memory cell string to obtain a second response, wherein the selected memory cell is biased at the read bias condition, and non-selected memory cells are biased in the conductive state; and
    a determining circuit to determine the logical state of the selected memory cell using the discrepancy between the first response and the second response.

17. The integrated circuit of claim 16, further comprising:
    a correlator to correlate the discrepancy between the first response and the second response to a plurality of predefined discrepancy responses, each of the predefined discrepancy responses corresponding to a stored logical state of the selected memory cell, wherein the logical state corresponding to the predefined discrepancy response having the closest correlation to the computed discrepancy response is deemed as the stored logical state of the memory cell.

18. The integrated circuit of claim 16, wherein the measurement circuit is configured to measure an output current response when each of the memory cells is biased in the conductive state, and when performing the second measurement measuring the output current response of the memory cell string when
    (i) the selected memory cell is biased at the read level bias condition; and
    (ii) each of the non-selected memory cells is biased in the conductive state.

19. A computer program product, resident on a computer readable medium, operable to execute instructions for reading a logical state of a selected one of a plurality of memory cells included within a memory cell string of an integrated circuit, the computer program product comprising:
    instruction code to define a read bias condition for at least the selected memory cell;
    instruction code to perform a first measurement of the memory cell string to obtain a first response, wherein each of the memory cells in the memory cell string is biased in a conductive state;
    instruction code to perform a second measurement of the memory cell string to obtain a second response, wherein the selected memory cell is biased at the read bias condition, and non-selected memory cells are biased in the conductive state; and
    instruction code to determine the logical state of the selected memory cell using the discrepancy between the first response and the second response.

\* \* \* \* \*